United States Patent [19]
Hong et al.

[11] Patent Number: 5,430,673
[45] Date of Patent: Jul. 4, 1995

[54] BURIED BIT LINE ROM WITH LOW BIT LINE RESISTANCE

[75] Inventors: Gary Hong; Chen-Chiu Hsue, both of Hsin, Taiwan

[73] Assignee: United Microelectronics Corp., Hsin, Taiwan

[21] Appl. No.: 92,189

[22] Filed: Jul. 14, 1993

[51] Int. Cl.⁶ .................. H01L 27/10; H01L 29/78
[52] U.S. Cl. .................... 365/182; 257/302; 257/377; 257/368; 257/321
[58] Field of Search .............. 365/185, 182; 257/301, 257/321

[56] References Cited

U.S. PATENT DOCUMENTS 4,222,062  9/1980  Trotter et al. .................. 365/185
4,912,535  3/1990  Okumura ....................... 257/301
5,017,977  5/1992  Richardson .................... 365/185
5,278,438  1/1994  Kim et al. ..................... 365/185

FOREIGN PATENT DOCUMENTS 63-207171  8/1988  Japan .
63-266447  4/1990  Japan .

*Primary Examiner*—Viet Q. Nguyen
*Attorney, Agent, or Firm*—Meltzer, Lippe, Goldstein et al.

[57] ABSTRACT

A ROM array comprises orthogal sets of buried bit lines and polysilicon wordlines. The buried bit lines comprise trenches with insulating material on the side walls, the trenches then being filled with polysilicon. Theis reduces bit line sheet resistance and increases the punch through voltage between adjacent bit lines.

15 Claims, 3 Drawing Sheets

BURIED BIT LINE ROM WITH LOW BIT LINE RESISTANCE

FIELD OF THE INVENTION

The present invention relates to a buried bit line ROM with a low bit line sheet resistance and a high punch through voltage.

BACKGROUND OF THE INVENTION

High sheet resistance ($R_S$) of buried bit lines in a ROM becomes more severe when the cell dimension shrinks as memory density increases. When the cell dimension shrinks, the bit line width also shrinks and the bit line sheet resistance increases. In addition, the punch through voltage between adjacent bit lines becomes unacceptably low.

FIG. 1 illustrates a buried bit line ROM 10. The ROM 10 comprises a P-type silicon substrate 11. A plurality of N+-type buried bit lines 12 are formed in the ROM 10. Each bit line has a width W and the spacing between adjacent bit lines is S. A plurality of polysilicon word lines 14 are also formed on the surface of the substrate 11. The ROM 10 comprises a plurality of cells. One such cell 30 is delineated in FIG. 1 and shown in a cross-section view taken along the line AA' in FIG. 2.

As shown in FIG. 2, the cell 30 comprises two adjacent buried bit lines 12 which form source and drain regions for the cell. A channel 22 of length S is formed between the two bit lines in the cell 30. A gate oxide layer 16 is formed on top of the substrate 11. The oxide layer is thick at portions 18 which are located above the bit lines 12 and thin at portion 20 located over the channel 22. A polysilicon word line 24 is formed over the gate oxide layer 16.

As indicated above, when the bit line width W is too small, the bit line sheet resistance is unacceptably high. In addition, when the bit line spacing S is too small, the punch through voltage between adjacent bit lines is unacceptably low.

It is an object of the present invention to provide a buried bit line structure and a method for making a buried bit line structure which eliminates the sheet resistance and punch through voltage problems in high density buried bit line ROMs with small bit line width and small bit line spacing.

SUMMARY OF THE INVENTION

The present invention uses a trench filled with polysilicon to form the buried bit lines in a ROM or EPROM. This reduces bit line resistance and increases punch through voltage.

DETAILED DESCRIPTION OF THE INVENTION

FIGS. 3-7 illustrate the formation of buried bit lines in accordance with the present invention.

Figure 1:
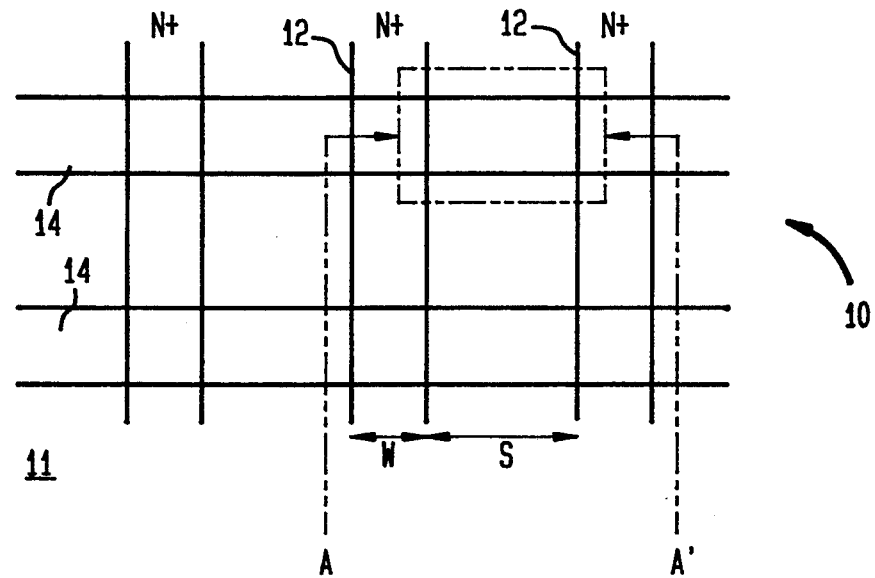
FIG. 1 illustrates a conventional buried bit line ROM array.
Figure 2:
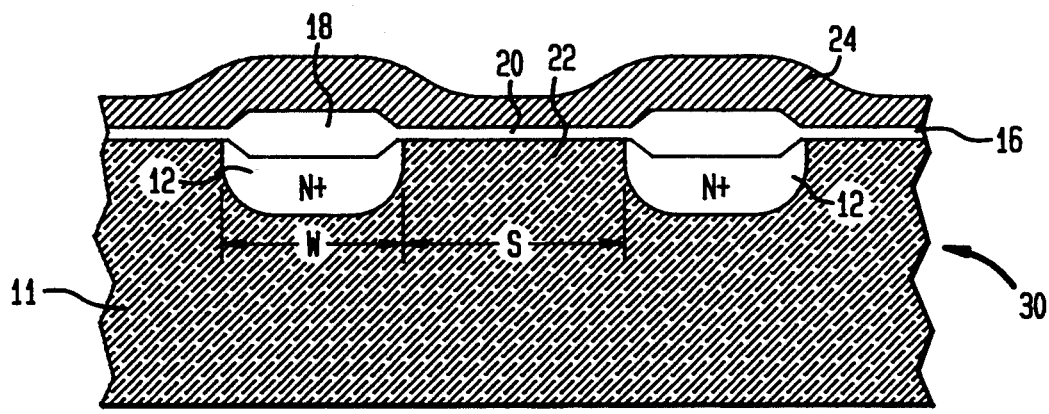
FIG. 2 illustrates a cross-section of one ROM cell in the array of FIG. 1.
Figure 3:
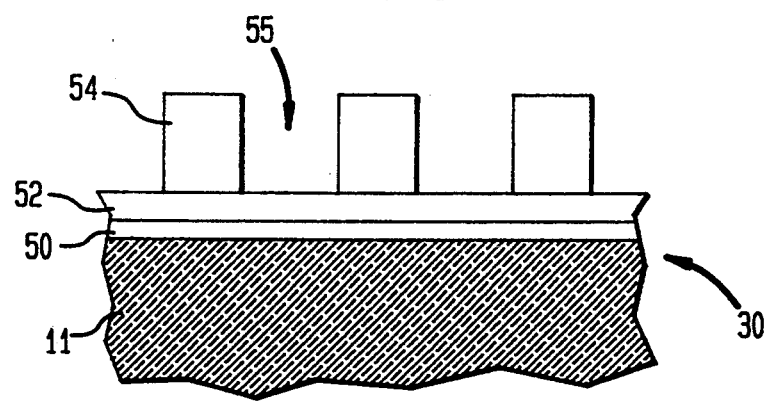
FIGS. 3, 4, 5, 6 and 7 illustrate the formation of buried bit lines by the formation of polysilicon filled trenches.

As shown in FIG. 3, the starting point is a silicon substrate 11 which illustratively is of P-type. The substrate is doped with boron atoms. An oxide ($SiO_2$) layer 50 with a thickness of about 200 Angstroms is deposited on the surface of the substrate. A silicon nitride layer 52 with a thickness of 1000 Angstroms is then deposited on top of the oxide 50.

A layer of photo-resist (PR) is then deposited on top of the nitride 52. The layer of photo-resist is then patterned to form the photo-resist stripe portions 54, which stripes are separated by the openings 55.

Figure 4:
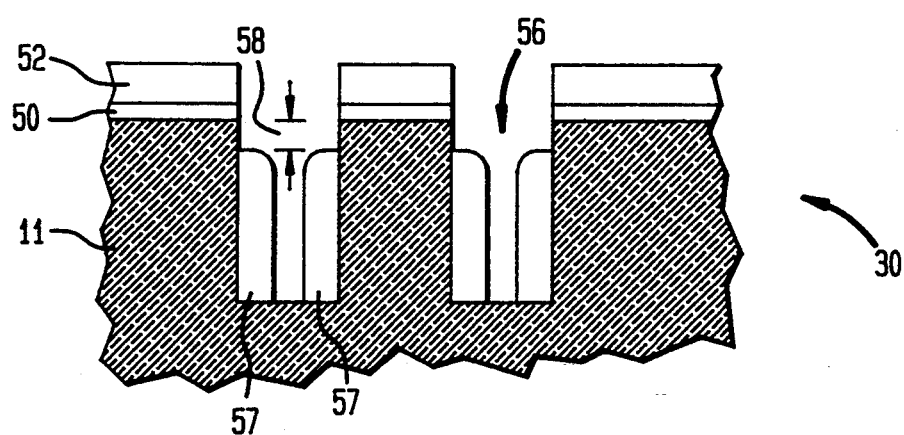

Using the photo-resist stripes 54 as a mask, the substrate 11 is etched using a dry etch to a depth of 1 micron. The photo-resist portions 54 are then removed. The resulting trenches 56 are shown in FIG. 4.

$SiO_2$ is then deposited or thermally oxidized on the side walls and bottom of the trenches 56 to a thickness of 1000~2000 Angstroms.

The $SiO_2$ is then etched and over-etched to remove the $SiO_2$ from the bottom of the trenches 56 to form the oxide spacers 57 and the oxide spacer over-etch region 58. The depth of the oxide spacer over-etch region 58 is about 0.1 micron.

Figure 5:
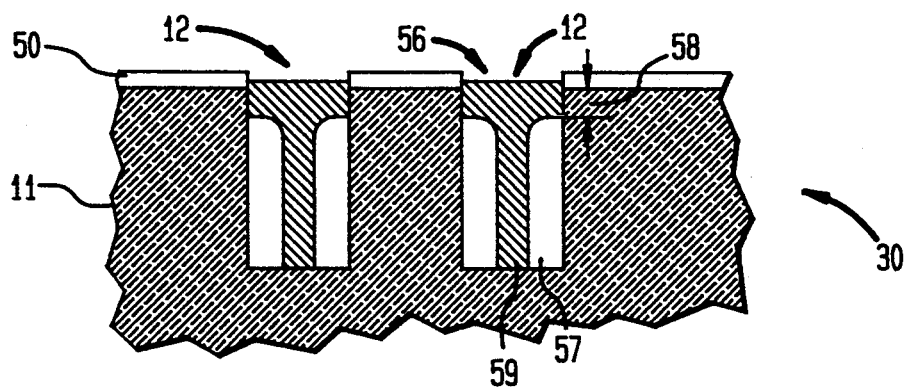

As shown is FIG. 5, the nitride layer 52 is then stripped and the trenches are filled with polysilicon material 59 to form the bit lines 12.

The polysilicon material is doped to be N+-type. The doping can be accomplished using $POCl_3$. Alternatively As can be implanted using ion implantation at 50 KeV. The dose of the N+ dopant in the polysilicon 59 is $5E15/cm^2 - 2E16/cm^2$. Then, the oxide layer 50 is stripped.

Figure 6:
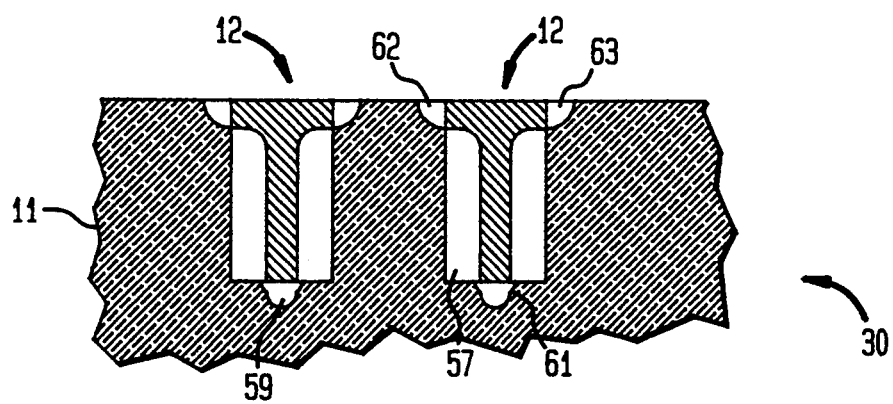

As shown in FIG. 6, N+ side diffusion is utilized in the regions 61, 62, 63 of each of the two bit lines in the cell 30 to form the source and drain of the memory cell 30. Thus, the source is formed by one set of regions 61, 62, 63 of one bit line 12 and the drain is formed by another set of regions 61, 62, 63 of an adjacent bit line 12.

Figure 7:
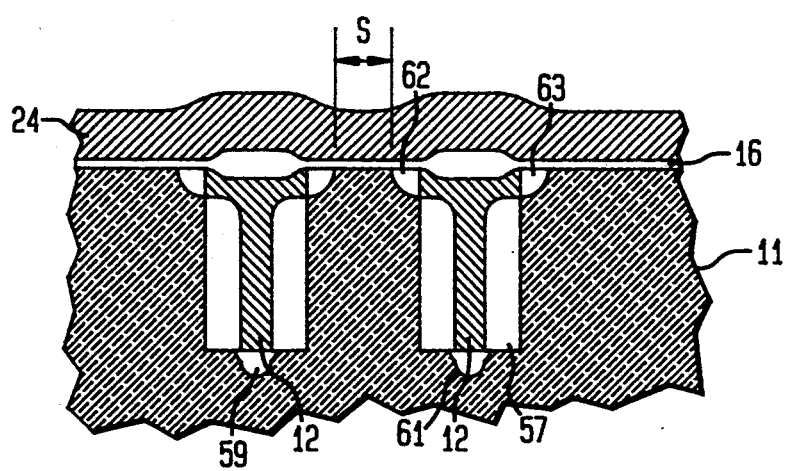

As shown in FIG. 7, a gate oxide layer 16 is then formed on the substrate 11. The gate oxide has a thickness of about 500 Angstroms on top of the bit lines 12 and a thickness of about 150 Angstroms on top of the channel between the bit lines 12. The polysilicon wordline 24 is then formed on top of the oxide layer 16.

The rest of the processes for completing the ROM array are entirely conventional back-end processes including BPSG, contacts, metalization and ROM coding.

The buried bit lines formed using the above described poly trench method result in low bit line sheet resistance and good bit line-to-bit line punch through voltage. Therefore, the bit line pitch (bit line width plus spacing between adjacent bit lines) can be reduced for a high density ROM array.

The above described process can also be used for bit lines in an EPROM (Erasable Programmable Read Only Memory).

Finally, the above described embodiments of the invention are intended to be illustrative only. Numerous alternative embodiments may be devised by those skilled in the art without departing from the spirit and scope of the following claims.

We claim:

1. A buried bit line for use in either of a ROM and an EPROM memory array, comprising:
    a semiconductor substrate having a trench formed therein, insulation material covering a portion of walls of said trench said insulation material not covering at least an upper portion of the walls, and heavily doped material in said trench and contacting said substrate at the portion of the walls of said trench not covered by said insulation material.

2. The buried bit line of claim 1 wherein
said substrate is silicon,
said insulation material is SiO$_2$, and
said heavily doped material is doped polysilicon.

3. The buried bit line of claim 1 wherein a bottom surface of said trench is not covered with said insulation material.

4. A memory cell comprising:
a semiconductor substrate having first and second spaced apart trenches formed therein;
insulation material covering a portion of walls of said trenches, at least an upper portion of the walls not being covered with the insulation material;
a heavily doped material deposited in said trenches and in contact with said substrate to form source and drain regions;
a gate insulating layer formed on said substrate, said gate insulating layer being thicker in the portions over said trenches than in the portion over a channel between said trenches; and
a conducting layer formed over said gate insulating layer.

5. The memory cell of claim 4 wherein:
said substrate is silicon,
said insulation material on said walls of said trenches is SiO$_2$,
said heavily doped material in said trenches is doped polysilicon,
said gate insulating layer is formed from oxide, and
said conducting layer is polysilicon.

6. A method for forming a buried bit line for a memory array, comprising the steps of:
a) forming a trench in a semiconductor substrate;
b) depositing an insulating material in said trench;
c) removing a portion of said insulating material so at least a an upper portion of the trench is exposed; and
d) placing a heavily doped material in said trench for contacting said exposed portion of said wall.

7. The method of claim 6 wherein the conductive material includes dopant and further comprising the step of diffusing dopant from said heavily doped material into said substrate through said exposed portion of said wall.

8. The method of claim 6 wherein said substrate is silicon and said step of forming a trench is performed by etching.

9. The method of claim 8 wherein said insulating material is SiO$_2$.

10. The method of claim 9 wherein said removing step comprises etching and then overetching said insulating material.

11. The method of claim 7 wherein said heavily doped material is doped polysilicon and wherein impurities in said polysilicon are diffused into said substrate.

12. The method of claim 11 further comprising the step of depositing an oxide layer and a polysilicon layer on top of said trench.

13. The method of claim 6, wherein the step of removing further includes removing a portion of said insulating material so a bottom portion of the trench is exposed.

14. A buried bit line for use in a memory array comprising:
(a) a semiconductor substrate having a trench formed therein, the trench having walls and a bottom surface;
(b) insulation material covering a portion of said trench so that at least an upper portion the of the walls is not covered; and
(c) a conducting material deposited in said trench and contacting said substrate at the portion of the trench not covered by said insulation material.

15. The buried bit line of claim 14, wherein the portion of the trench not covered by insulation material includes the bottom surface of the trench.

* * * * *